(12) United States Patent
Kosaka

(10) Patent No.: US 11,255,819 B2
(45) Date of Patent: Feb. 22, 2022

(54) INSULATION INSPECTION DEVICE AND METHOD

(71) Applicant: DENSO CORPORATION, Kariya (JP)

(72) Inventor: Yuki Kosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 139 days.

(21) Appl. No.: 16/839,593

(22) Filed: Apr. 3, 2020

(65) Prior Publication Data

US 2020/0319142 A1 Oct. 8, 2020

(30) Foreign Application Priority Data

Apr. 3, 2019 (JP) .............................. JP2019-071457

(51) Int. Cl.

| | | |
|---|---|---|
| *G01N 27/72* | (2006.01) | |
| *G01N 27/82* | (2006.01) | |
| *G01R 33/12* | (2006.01) | |
| *G01N 27/83* | (2006.01) | |
| *H02K 1/16* | (2006.01) | |
| *G01N 27/9013* | (2021.01) | |
| *G01N 27/87* | (2006.01) | |

(Continued)

(52) U.S. Cl.
CPC .............. *G01N 27/83* (2013.01); *G01N 27/72* (2013.01); *G01N 27/82* (2013.01); *G01N 27/87* (2013.01); *G01N 27/902* (2013.01); *H02K 1/16* (2013.01); *F16L 55/38* (2013.01); *F16L 2101/30* (2013.01); *G01N 27/9006* (2013.01); *G01N 2291/2636* (2013.01)

(58) Field of Classification Search
CPC .. G01N 27/82; G01N 27/902; G01N 27/9006; G01N 2291/2636; G01N 27/72; G01N 27/87; G01N 27/83; F16L 2101/30; F16L 55/38; H02K 1/16; H02K 15/04; H02K 15/00; G01R 31/346; G01R 31/1272
USPC ............ 324/51, 55, 200, 219, 220, 260, 262
See application file for complete search history.

(56) References Cited

U.S. PATENT DOCUMENTS

| | | | |
|---|---|---|---|
| 2009/0127948 A1* | 5/2009 | Shimizu | H02K 3/50 310/71 |
| 2009/0267441 A1* | 10/2009 | Hiramatsu | H02K 15/066 310/208 |

(Continued)

FOREIGN PATENT DOCUMENTS

JP 2013-102569 A 5/2013

*Primary Examiner* — Raul J Rios Russo
(74) *Attorney, Agent, or Firm* — Oliff PLC

(57) ABSTRACT

An insulation inspection device for accurately inspecting films of wires for an insulation state in a short time before the wires are assembled into a core of an armature in a rotating electric machine, a power supply unit includes a first terminal and a second terminal. A support member supports a plurality of wires covered with films before the wires are assembled into a core of an armature in a rotating electric machine, and the support member is electrically connected to the first terminal. Areas of ends of a plurality of the wires from which areas the films are peeled off are installed on an installation base, and the installation base is electrically connected to the second terminal. A discharge detection unit detects discharge occurring between the support member and each of the wires when the power supply unit applies a voltage to the first terminal or the second terminal.

10 Claims, 10 Drawing Sheets

(51) Int. Cl.
  *G01N 27/90* (2021.01)
  *F16L 101/30* (2006.01)
  *F16L 55/38* (2006.01)

(56) References Cited

U.S. PATENT DOCUMENTS

| | | |
|---|---|---|
| 2014/0013592 A1 | 1/2014 | Yoshida et al. |
| 2015/0074985 A1 | 3/2015 | Ohno et al. |
| 2017/0141659 A1 | 5/2017 | Hashimoto et al. |
| 2017/0141660 A1 | 5/2017 | Hashimoto et al. |
| 2018/0097426 A1 | 4/2018 | Ohno et al. |
| 2018/0367014 A1 | 12/2018 | Hashimoto et al. |
| 2020/0185997 A1* | 6/2020 | Hirasawa ............ H02K 15/0062 |

* cited by examiner

US 11,255,819 B2

INSULATION INSPECTION DEVICE AND METHOD

CROSS-REFERENCE TO RELATED APPLICATION

This application is based on and claims the benefit of priority from earlier Japanese Patent Application No. 2019-071457 filed Apr. 3, 2019, the description of which is incorporated herein by reference.

BACKGROUND

Technical Field

The present disclosure relates to an insulation inspection device and an insulation inspection method for inspecting, for an insulation state, films of wires included in a rotating electric machine.

Related Art

A rotating electric machine has been known that is used in, for example, a motor generator mounted in an electric vehicle. A rotating electric machine of this type includes a stator coil including segment coils.

DESCRIPTION OF SPECIFIC EMBODIMENTS

Figure 1:
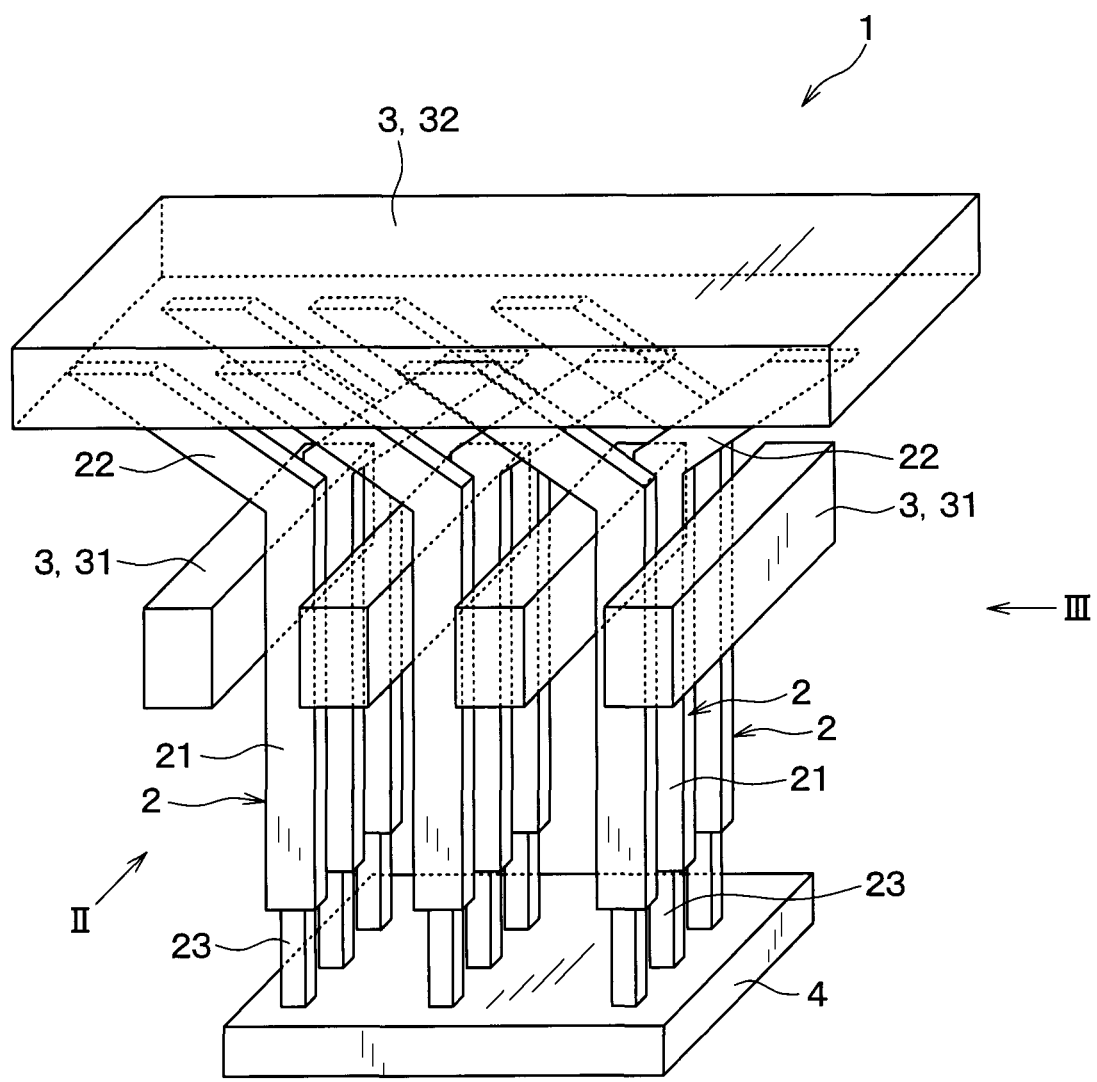
FIG. 1 is a schematic diagram illustrating a part of an insulation inspection device according to a first embodiment.

JP 2013-102569 A describes a method for manufacturing a rotating electric machine. In this manufacturing method, first, a plurality of U-shaped wires used to form segment coils are combined together into a ring shape and held using a temporary assembly jig. Then, the plurality of wires held using the temporary assembly jig are inserted into a slot in a stator core. Subsequently, areas of the plurality of wires that protrude from the slot in the stator core are twisted, and then ends of the plurality of wires for a U phase, a V phase, and a W phase are joined together. Furthermore, the wires for the respective phases are joined together at neutral points to form a Y connection or the like. Note that, in JP 2013-102569 A, the temporary assembly jig is referred to as an inner-diameter fixing ring and a coil clamper.

Coils in a rotating electric machine include a conductor with a surface covered with a film formed of an insulator such as enamel. Thus, a flaw in the film causes insufficient insulation, which may lead to phase-to-phase, intra-phase, or to-ground short-circuiting. Note that □phase-to-phase□refers to coils forming any two respective phases of the three phases. □Intra-phase□refers to coils forming one phase. □To-ground□refers to the coil and the stator core.

A manufacturing process for the rotating electric machine includes a step of inspecting the film for an insulation state to prevent insufficient insulation of the film. Note that JP 2013-102569 A does not describe the insulation inspection for the film.

In general, the following methods (A), (B), and (C) are performed as the insulation inspection for the film.

(A) A method for insulation inspection in which a voltage is applied to the plurality of wires one by one before the wires are inserted into the slot in the stator core.

(B) A method for insulation inspection in which an electrode is made closer to the wires after the wires are inserted into the slot in the stator core.

(C) A method for insulation inspection in which a phase-to-phase voltage, an intra-phase voltage, and a to-ground voltage are applied after the wires are inserted into the slot in the stator core.

However, the insulation inspections based on the methods (A), (B), and (C) described above pose the following problems.

In the method (A), the plurality of wires are inspected one by one, and thus an extended time is required to inspect, for insulation, all the wires to be assembled in the stator core.

The method (B) needs to make adjustment needed to prevent the voltage applied to the wires from being discharged to the stator core. Thus, a part of the entire range of each wire that can be inspected for insulation decreases consistently with the voltage applied to the wires.

The method (C) is limited to insulation inspections for a case where inspection areas to which the voltage is applied are adjacent to each other. Thus, in a case where areas of the wires where the wires are not adjacent to each other have a flaw, possible foreign material entering the area may cause short circuiting.

In view of the foregoing, it is desired to have an insulation inspection device and an insulation inspection method that enable accurate inspection of films of wires for an insulation state before the wires are assembled into a core of an armature in a rotating electric machine, reducing manufacturing costs.

A first aspect of the present disclosure provides an insulation inspection device inspecting, for an insulation state, films of wires included in a rotating electric machine includes a power supply unit, a support member, an installation base, and a discharge detection unit. The power supply unit includes a first terminal and a second terminal. The support member supports a plurality of the wires covered with the films before a plurality of the wires are assembled into a core of an armature in the rotating electric machine, and the support member is electrically connected to the first terminal. Areas of ends of a plurality of the wires from which areas the films are peeled off are installed on the installation base, and the installation base is electrically connected to the second terminal. The discharge detection unit detects discharge occurring between the support member and each of the wires when the power supply unit applies a voltage to the first terminal or the second terminal.

Accordingly, the insulation inspection device can collectively inspect the plurality of wires supported by the support member before the plurality of wires are assembled into the core of the armature in the rotating electric machine. Thus, the insulation inspection for the plurality of wires can be performed in a short time.

Additionally, the insulation inspection device inspects the wires for insulation before the wires are assembled into the core of the armature in the rotating electric machine, preventing the voltage applied to the wires from being discharged to the core. Thus, the voltage applied to the wires can be increased without consideration for discharge to the core. Accordingly, an inspection range for the wires can be extended.

Additionally, the insulation inspection device inspects the wires for insulation before the wires are assembled into the core of the armature in the rotating electric machine, and can thus directly inspect the entire range of each of the wires including an area of the wire inserted into the core in a subsequent step.

Furthermore, the insulation inspection device inspects the wires for insulation before the wires are assembled into the core of the armature in the rotating electric machine, and thus, in a case where an insulation property of the film of any of the wires is determined not to satisfy a predetermined criterion, the wire can be exclusively disposed of without disposal of the core. Thus, manufacturing costs can be reduced.

A second aspect of the present disclosure provides an isolation inspection method for inspecting films of wires included in a rotating electric machine for an insulation state. The insulation inspection method includes, before assembling, into a core of an armature in the rotating electric machine, a plurality of the wires covered with the films, supporting a plurality of wires using a support member and installing, on an installation base, areas of ends of a plurality of the wires from which areas the films are peeled off, applying a voltage from a power supply unit to a plurality of the wires via the support member or the installation base and detecting discharge occurring between the support member and each of the wires, and determining whether the film of the wire is acceptable based on a discharge rate of the wire.

Accordingly, this aspect of the present disclosure can provide the same functions and effects as those of the first aspect of the present disclosure described above. Note that the discharge rate is a value calculated from a voltage drop during discharge with respect to a voltage applied by the power supply unit. Alternatively, the discharge rate is a value calculated from a current value for a current flowing through a circuit during discharge.

Note that parenthesized reference numerals assigned to components and the like indicate an example of corresponding relations between the components and the like and specific components and the like described below in embodiments.

Embodiments of the present disclosure will be described below with reference to the drawings. Note that, in the embodiments described below, identical or equivalent components are assigned identical reference signs and that description of the components is omitted.

First Embodiment

Figure 2:
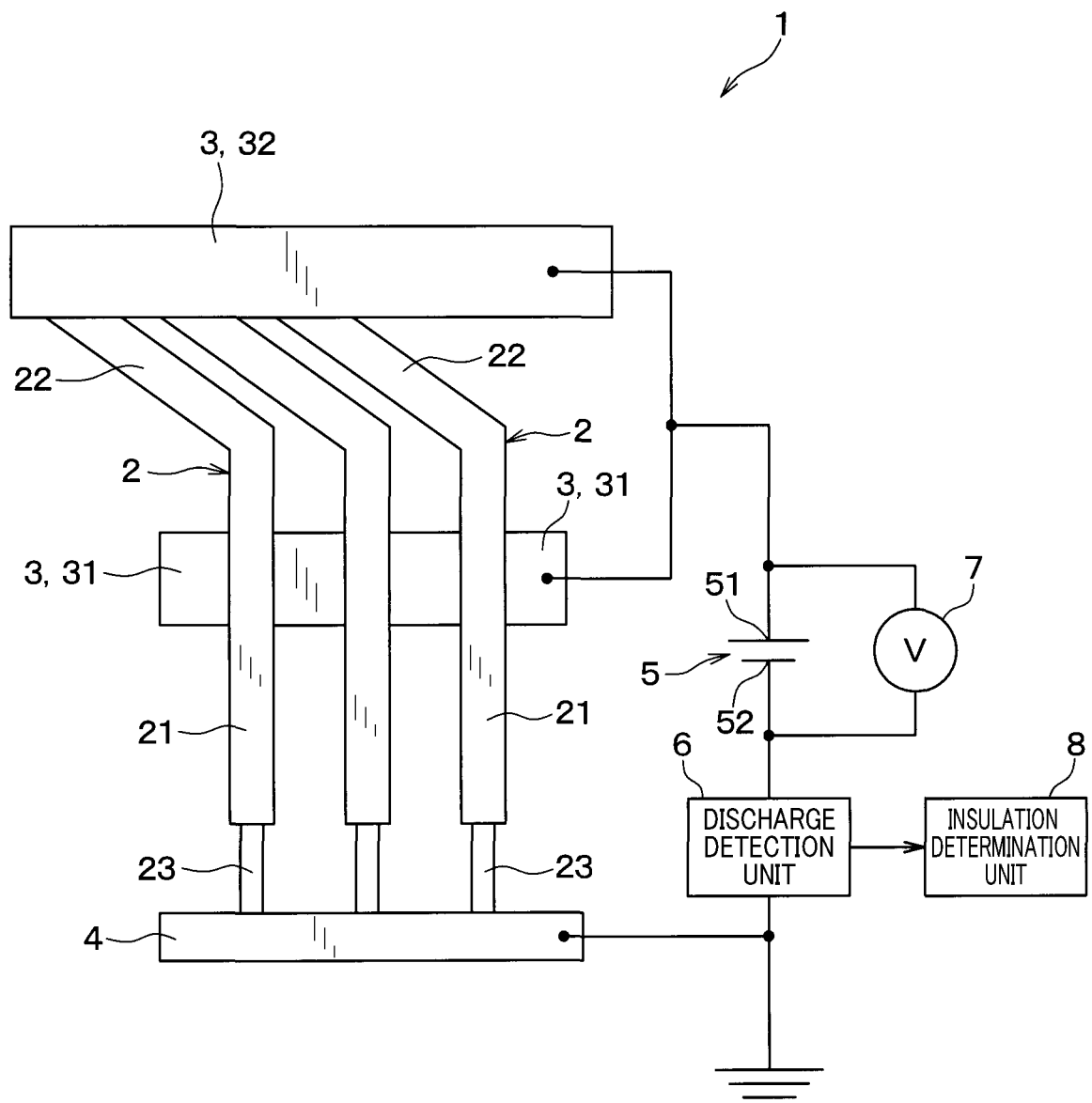
FIG. 2 is a schematic diagram illustrating a circuit configuration of the insulation inspection device as viewed in the direction of arrow II in FIG. 1.
Figure 3:
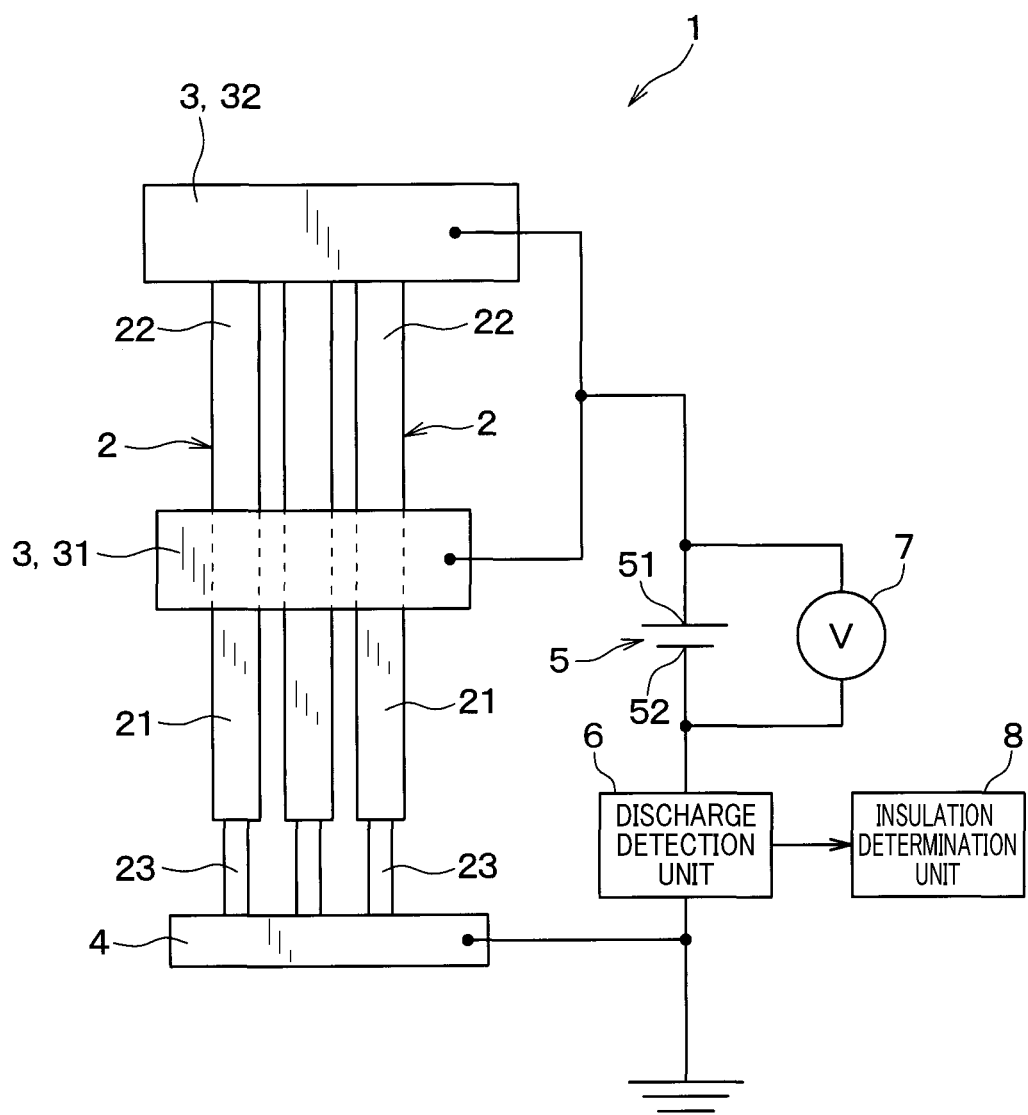
FIG. 3 is a schematic diagram illustrating the circuit configuration of the insulation inspection device as viewed in the direction of arrow III in FIG. 1.

A first embodiment will be described with reference to the drawings. As illustrated in FIGS. 1 to 3, an insulation inspection device 1 according to the present embodiment is a device inspecting, for an insulation state, films applied to segment coils included in a stator coil in a rotating electric machine not illustrated. Note that the rotating electric machine is used in, for example, a motor generator mounted in an electric vehicle.

FIGS. 1 to 3 are schematic diagrams illustrating a part of the insulation inspection device 1 and parts of a plurality of wires 2 supported in the insulation inspection device 1. A plurality of wires 2 are generally U-shaped to form segment coils and each include two straight portions 21 and an angle connection portion 22 connecting the two straight portions 21. However, FIGS. 1 to 3 illustrate only one of the straight portions 21 and half of the connection portion 22 for each of the generally U-shaped wires 2. Each of the plurality of wires 2 is covered with a film formed of an insulator such as enamel. At an end of the straight portion 21 of the wire 2 which end is located opposite to the connection portion 22 (the end is hereinafter referred to as the □end 23 of the wire 2□), the film is peeled off to expose the conductor.

The insulation inspection device 1 inspects the plurality of wires 2 forming segment coils and temporarily assembled in a ring shape before the wires 2 are inserted into a slot in a stator core as an armature included in the rotating electric machine not illustrated. Specifically, the insulation inspection device 1 functions to inspect the wires 2 for insulation and to serve as a temporary assembly jig for temporary assembly of the plurality of wires 2 in a ring shape.

The insulation inspection device 1 includes a support member 3, an installation base 4, a power supply unit 5, a discharge detection unit 6, a voltage detection unit 7, and an insulation determination unit 8.

The support member 3 is a member supporting the plurality of wires 2 temporarily assembled in a ring shape. The support member 3 includes an intermediate jig 31 and an upper jig 32. The intermediate jig 31 and the upper jig 32 are formed of a conductor such as metal. Thus, the support member 3 functions as an electrode.

The intermediate jig 31 is disposed between the straight portions 21 of the plurality of wires 2. The intermediate jig 31 supports the plurality of wires 2 in alignment.

The upper jig 32 is disposed on the connection portion 22 side of each of the plurality of wires 2 and in contact with the connection portions 22.

The installation base 4 is a member on which the ends 23 of the plurality of wires 2 are installed. The installation base 4 is in contact with the ends 23 of the plurality of wires 2. The installation base 4 is formed of a conductor such as metal. Thus, the installation base 4 functions as an electrode.

In this way, the insulation inspection device 1, including the intermediate jig 31 and the installation base 4, can support the plurality of wires 2 temporarily assembled in a ring shape.

As illustrated in FIG. 2 and FIG. 3, the power supply unit 5 is a DC power supply. The power supply unit 5 includes a first terminal 51 and a second terminal 52. In the present embodiment, the first terminal 51 is a positive electrode, and the second terminal 52 is a negative electrode.

The intermediate jig 31 and the upper jig 32 are electrically connected to the first terminal 51. On the other hand, the installation base 4 is electrically connected to the second terminal 52. Thus, the power supply unit 5 can apply a predetermined voltage to the plurality of wires 2 through the intermediate jig 31 and the upper jig 32.

The discharge detection unit 6 is provided hallway through a wire connecting the second terminal 52 of the power supply unit 5 and the installation base 4. The discharge detection unit 6 is configured to detect discharge occurring between the support member 3 and each of the wires 2 when a voltage is applied by the power supply unit 5. Specifically, the discharge detection unit 6 detects a voltage drop during discharge. Alternatively, the discharge detection unit 6 detects the value of a current flowing through a circuit during discharge.

The voltage detection unit 7 is connected in parallel with the first terminal 51 and the second terminal 52. The voltage detection unit 7 is configured to detect a potential difference between the first terminal 51 and the second terminal 52. Accordingly, the voltage detection unit 7 detects an output voltage from the power supply unit 5.

A detection value from the discharge detection unit 6 and a detection value from the voltage detection unit 7 are input to the insulation determination unit 8. The discharge detection unit 6 compares the detection value from the discharge detection unit 6 with the detection value from the voltage detection unit 7 to calculate a discharge rate of each of the wires 2. Note that the discharge rate is a value calculated from a voltage drop during discharge with respect to the voltage applied by the power supply unit 5. Alternatively, the discharge rate is a value calculated from a current value for a current flowing, during discharge, through a circuit in which the discharge detection unit 6 is installed.

The insulation inspection device 1 configured as described above can apply a voltage from the power supply unit 5 to the plurality of wires 2 via the support member 3 to inspect the films of the wires 2 for the insulation state.

Figure 4:
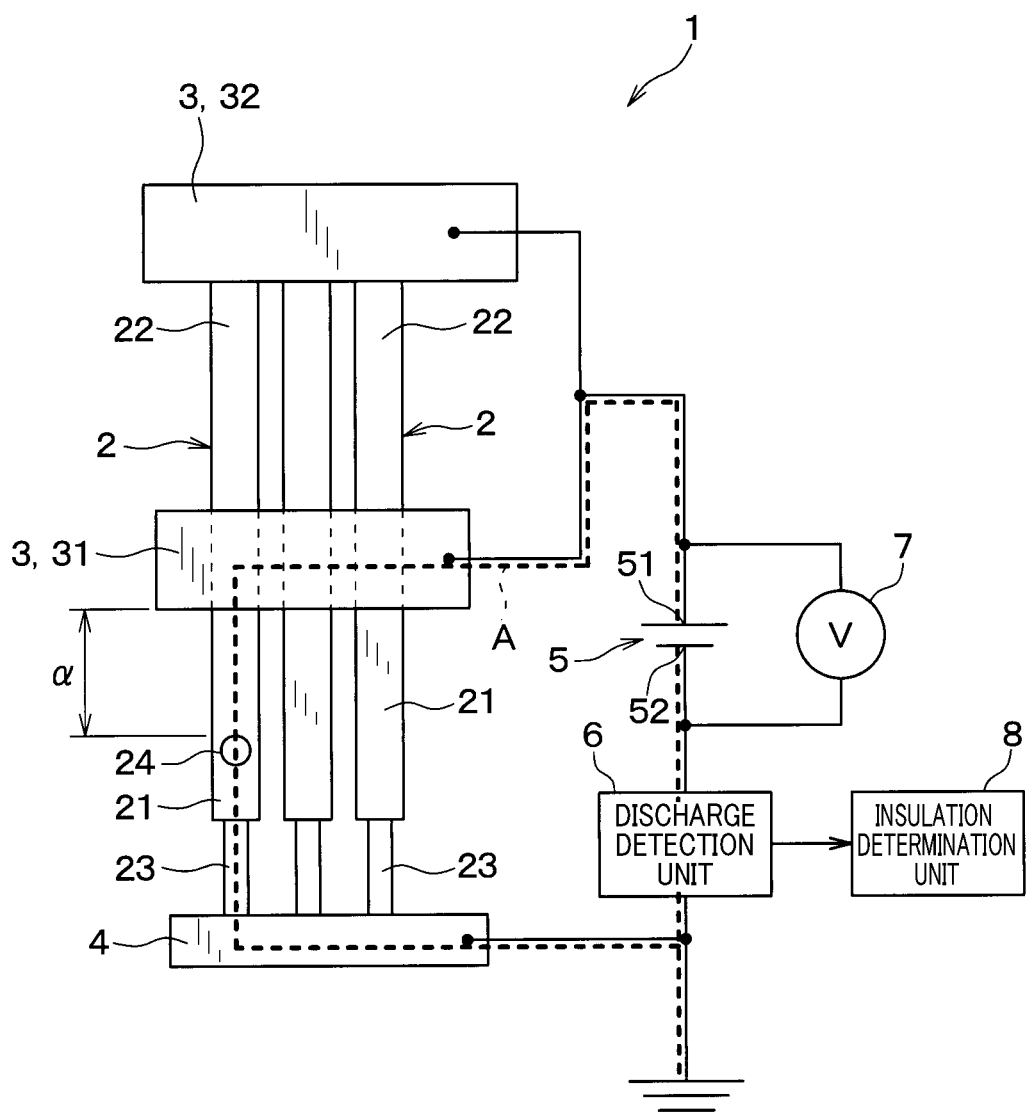
FIG. 4 is an explanatory diagram illustrating a flow of a current in a case where a part of a wire has a flaw.

In FIG. 4, a dashed line A represents a path through which, in a case where any of the wires 2 has a flaw 24 in an area of the wire 2 located between the intermediate jig 31 and the installation base 4, a current flows due to short circuiting between the flaw 24 in the wire 24 and the intermediate jig 31. Note that arrow α in FIG. 4 represents a range of creeping discharge along the film of the wire 2.

Figure 5:
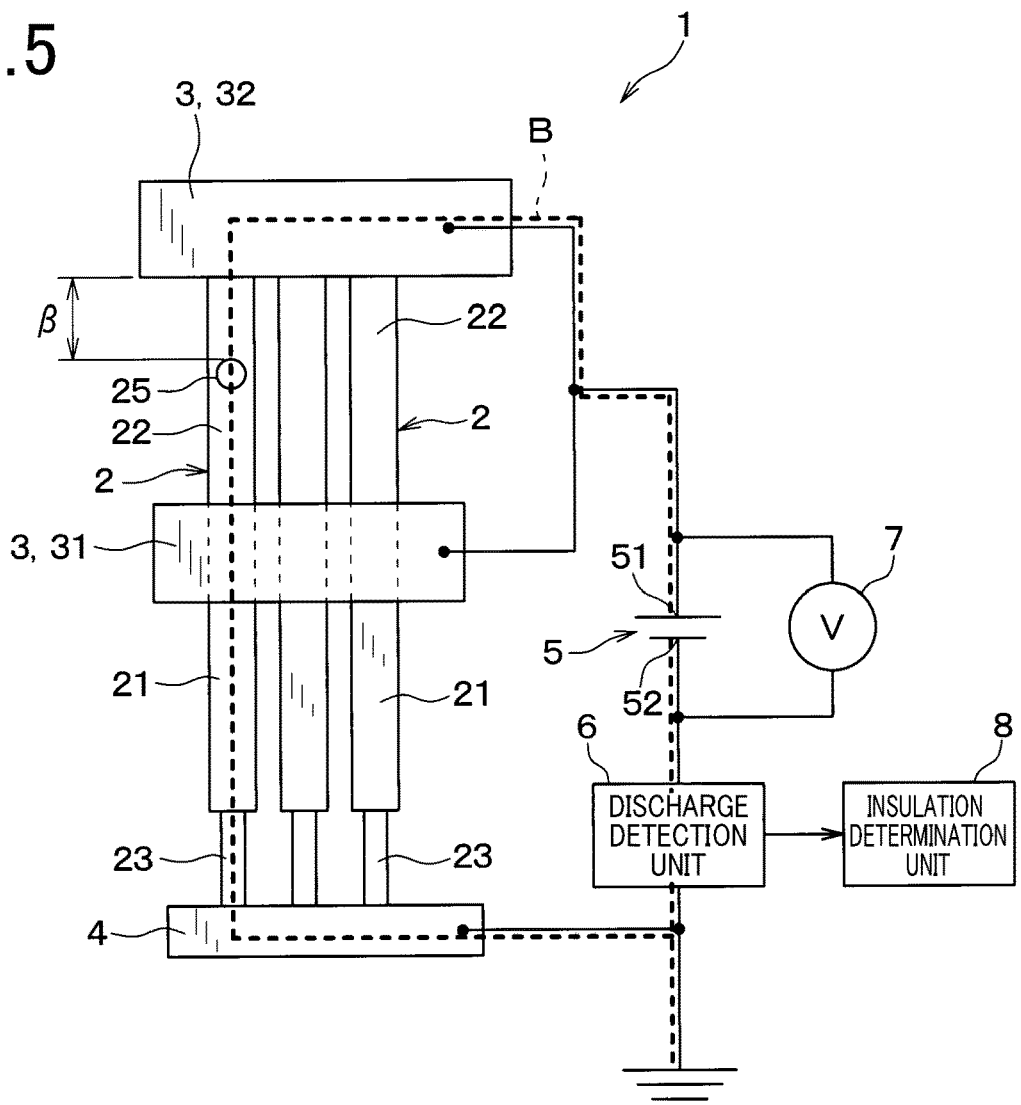
FIG. 5 is an explanatory diagram illustrating a flow of a current in a case where a different part of the wire has a flaw.

Additionally, in FIG. 5, a dashed line B represents a path through which, in a case where any of the wires 2 has a flaw 25 in an area of the wire 2 located between the upper jig 32 and the intermediate jig 31, a current flows due to short circuiting between the flaw 25 in the wire 2 and the upper jig 32. Note that arrow β in FIG. 5 represents a range of creeping discharge along the film of the wire 2.

As illustrated in FIG. 4 and FIG. 5, since the insulation inspection device 1 includes the intermediate jig 31 and the upper jig 32 as the support member 3, regardless of whichever part of the wire 2 has a flaw, the insulation inspection device 1 can cause discharge via the flaw.

Figure 6:
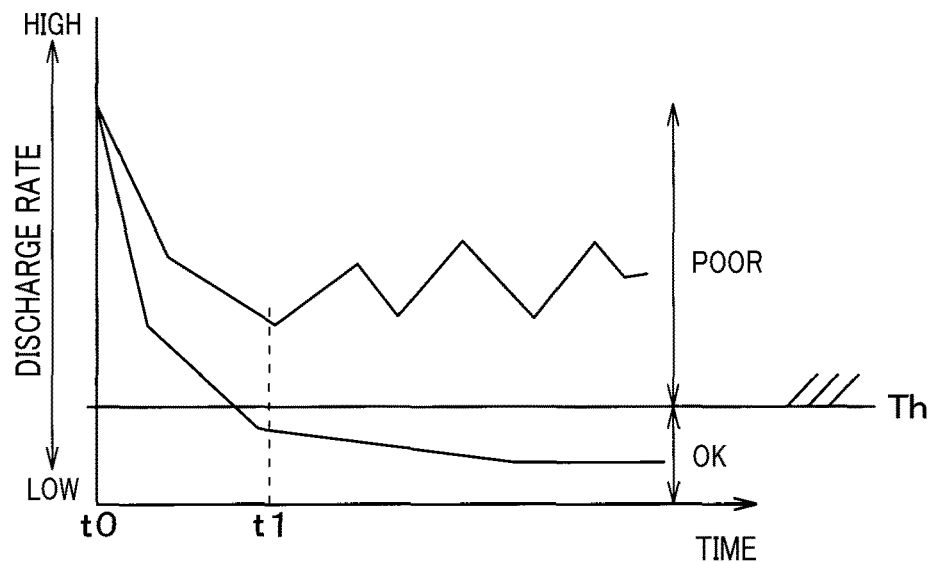
FIG. 6 is a graph illustrating how an insulation determination unit determines whether the wire is acceptable.

FIG. 6 is a graph illustrating determination of whether the insulation state of the wire 2 is acceptable, the determination being performed by the insulation determination unit 8. In the graph, the vertical axis indicates the discharge rate, and the horizontal axis indicates time.

The insulation determination unit 8 applies a voltage at a point in time t0, and a predetermined time t1 after the start of the inspection, determines the wires having a discharge rate lower than a determination threshold Th to be acceptable. On the other hand, the insulation determination unit 8 determines, the predetermined time t1 after the start of the inspection, determines the wires having a discharge rate higher than the determination threshold Th to be inacceptable.

Figure 7:
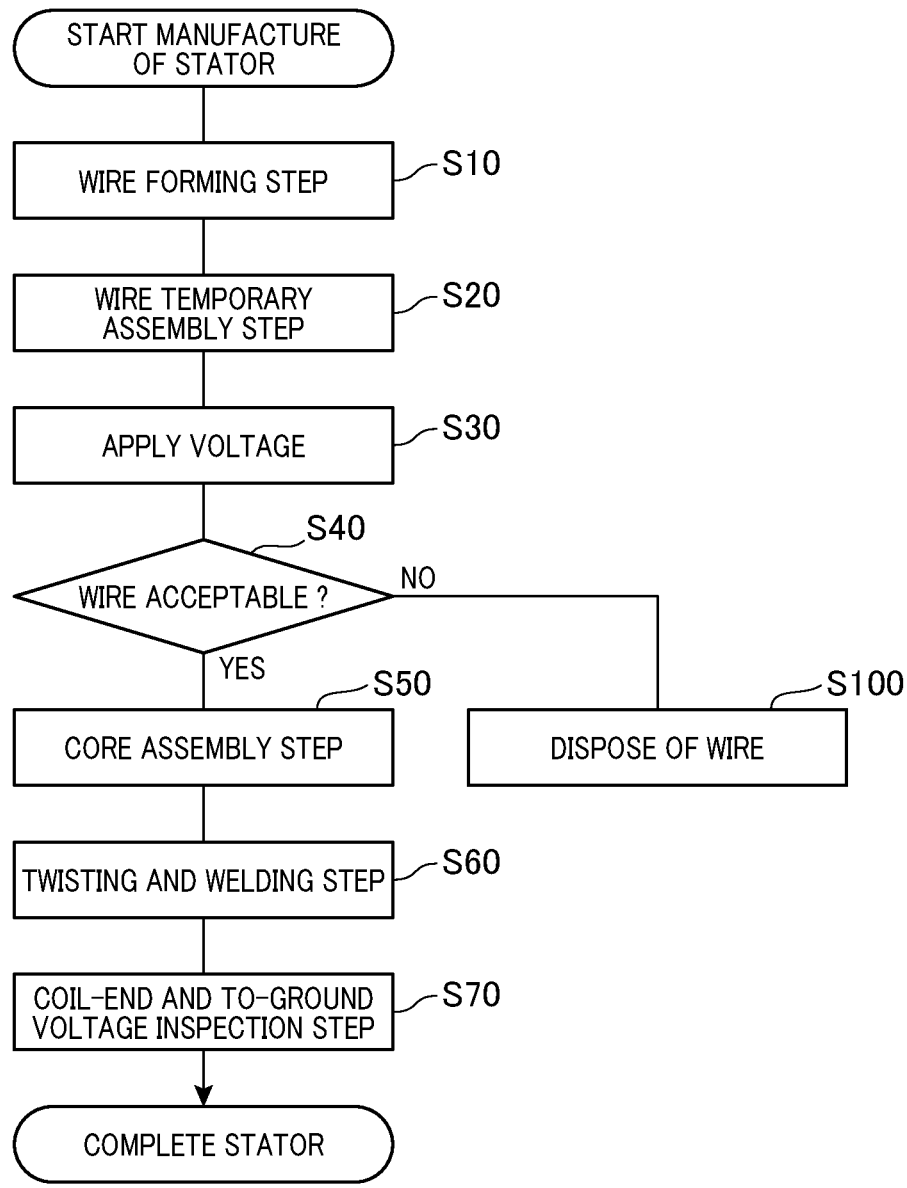
FIG. 7 is a flowchart illustrating a part of a manufacturing process for a stator of a rotating electric machine.

Now, a manufacturing method for a stator in the rotating electric machine will be described with reference to a flowchart in FIG. 7.

First, in step 10, a plurality of wires 2 are formed that are used to form segment coils. In this step, the plurality of wires 2, each including a conductor covered with a film, are cut into predetermined lengths, the films are peeled off at tips of the wires, and the wires are each generally bent into a U shape.

Then, in step S20, the plurality of wires 2 are temporarily assembled. In this step, the plurality of wires 2 are combined together in a ring shape and supported by the support member 3, and the ends 23 of the plurality of wires 2 are installed on the installation base 4.

Subsequently, in step S30, the power supply unit 5 applies a voltage to the plurality of wires 2 via the support member 3. Then, the discharge detection unit 6 detects discharge occurring between the support member 3 and each of the wires 2.

Then, in step S40, the insulation determination unit 8 calculates the discharge rate of the wire 2, and based on the discharge rate, determines whether the film of the wire 2 is acceptable. In a case where the insulation determination unit 8 determines the wire 2 to be inacceptable because the insulation state of film of the wire 2 does not satisfy the predetermined criterion, the process proceeds to step S100. In step S100, the wire 2 is disposed of.

On the other hand, in step S40, in a case where the insulation determination unit 8 determines the wire 2 to be acceptable because the insulation state of film of the wire 2 satisfies the predetermined criterion. The process proceeds to step S50.

In step S50, the plurality of wires 2 are removed from the support member 3 and the installation base 4 and inserted into the slot in the stator core.

Subsequently, in step S60, areas of the plurality of wires 2 protruding from the slot of the stator core are twisted, and the ends 23 of the plurality of wires 2 for a U phase, a V phase, and a W phase are welded together. Furthermore, neutral points and power lines for the respective phases are welded together.

Subsequently, in step S70, the coil ends of the segment coils are inspected for phase-to-phase insulation, intra-phase insulation, and to-ground insulation, and the stator is completed.

Note that steps S20 to S40 described above are steps corresponding to the insulation inspection method for the wires 2 using the insulation inspection device 1 according to the first embodiment.

The insulation inspection device 1 and the insulation inspection method according to the first embodiment described above produce the following functions and effects.

(1) In the insulation inspection device 1 and the insulation inspection method according to the first embodiment, the plurality of wires 2 are temporarily assembled using the support member 3 and the installation base 4, a voltage is applied to the plurality of wires 2 via the support member 3, and discharge occurring between the support member 3 and each of the wires 2 is detected. Accordingly, the plurality of wires 2 are collectively inspected, allowing the insulation inspection to be performed in a short time.

Additionally, in the insulation inspection device 1 and the insulation inspection method, the insulation inspection is performed on the plurality of wires 2 temporarily assembled, preventing the voltage applied to the wires 2 from being discharged to the stator core. Thus, the voltage applied to the wires 2 can be increased without consideration for discharge to the stator core. Accordingly, an inspection range for the wires 2 can be extended.

Furthermore, in the insulation inspection device 1 and the insulation inspection method, the insulation inspection is performed on the plurality of wires 2 temporarily assembled, allowing direct inspection of the entire range of each of the wires 2 including an area of the wire 2 inserted into the slot in the stator core in a subsequent step.

Additionally, in the insulation inspection device 1 and the insulation inspection method, the insulation inspection is performed on the plurality of wires 2 temporarily assembled, and thus in a case where the insulation property of the film of any of the wires 2 is determined not to satisfy the predetermined criterion, the wire 2 can be exclusively disposed of without disposal of the stator core. Thus, manufacturing costs can be reduced.

(2) In the insulation inspection device 1 and the insulation inspection method according to the first embodiment, the voltage detection unit 7 detects the potential difference between the first terminal 51 and the second terminal 52, and the insulation determination unit 8 determines whether the insulation state of each of the wires 2 is acceptable, based on the detection value from the discharge detection unit 6 and the detection value from the voltage detection unit 7. Accordingly, whether the insulation state of the wire 2 is acceptable can be accurately determined.

(3) The support member 3 included in the insulation inspection device 1 according to the first embodiment includes the intermediate jig 31 disposed between the plurality of wires 2 and the upper jig 32 disposed on the connection portion 22 side of each wire 2. This allows the entire wire 2 to be inspected even in a case where the wire 2 is long.

Second Embodiment

A second embodiment will be described. The second embodiment is the same as the first embodiment except for a partial change in configuration of the insulation inspection device 1, and the remaining part of the configuration is the same for the first embodiment and the second embodiment. Thus, only the part different from the corresponding part of the first embodiment will be described.

Figure 8:
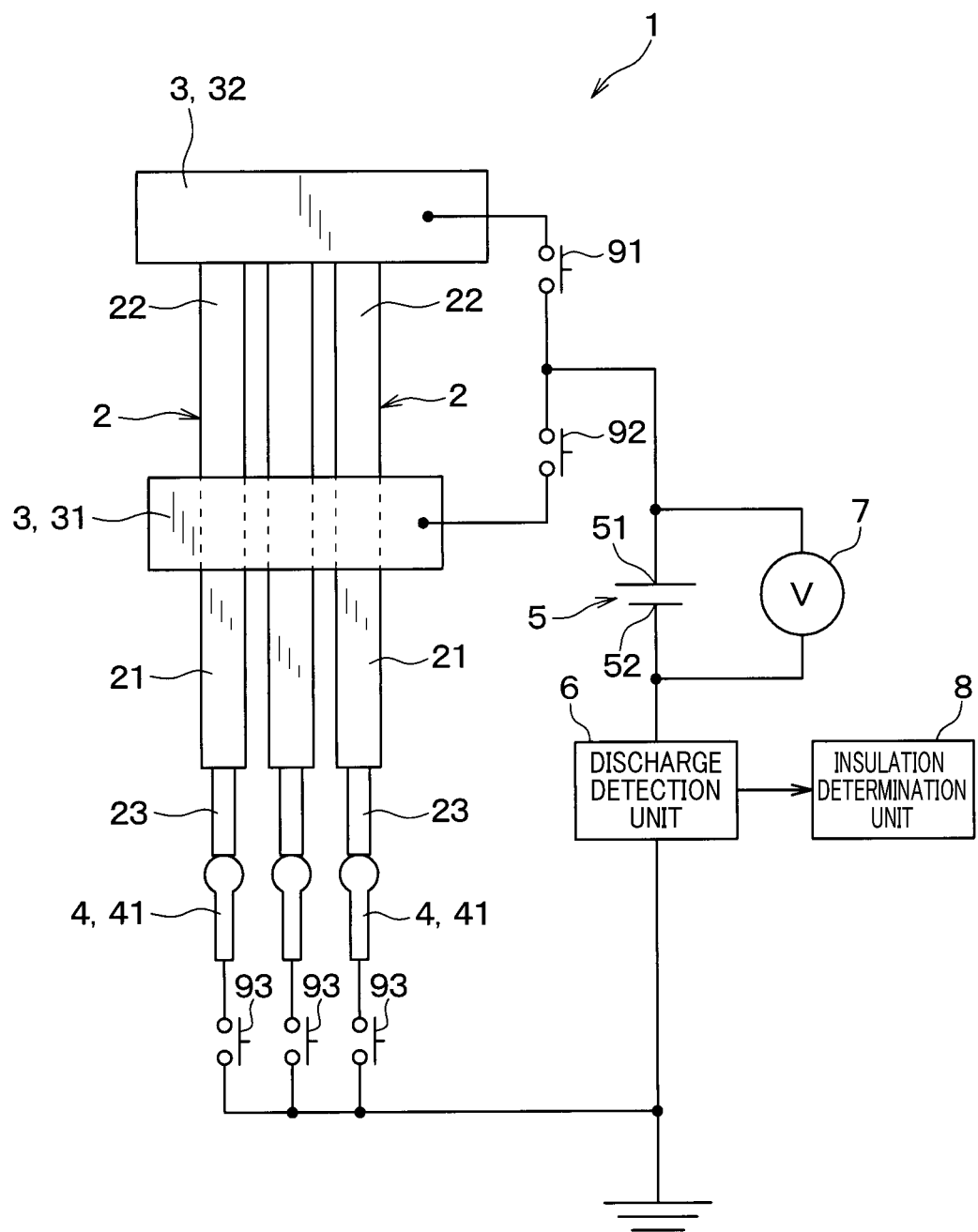
FIG. 8 is a schematic diagram illustrating a circuit configuration of an insulation inspection device according to a second embodiment.

As illustrated in FIG. 8, the insulation inspection device 1 according to the second embodiment includes an upper jig switch 91 disposed halfway through the wire connecting the first terminal 51 of the power supply unit 5 and the upper jig 32. The upper jig switch 91 is a switch that can electrically connect or disconnect the first terminal 51 to or from the upper jig 32.

Additionally, the insulation inspection device 1 includes an intermediate jig switch 92 disposed halfway through the wire connecting the first terminal 51 of the power supply unit 5 and the intermediate jig 31. The intermediate jig switch 92 is a switch that can electrically connect or disconnect the first terminal 51 to or from the intermediate jig 31.

In the insulation inspection for the wires 2, with the upper jig switch 91 turned on and with the intermediate jig switch 92 turned off, a voltage is applied to the plurality of wires 2 through the upper jig 32. Then, a discharge state of an area of each of the wires 2 located between the upper jig 32 and the intermediate jig 31 can be detected. On the other hand, in the insulation inspection for the wires 2, with the upper jig switch 91 turned off and with the intermediate jig switch 92 turned on, a voltage is applied to the plurality of wires 2 through the intermediate jig 31. Then, a discharge state of an area of each of the wires 2 between the intermediate jig 31 and the installation base 4. Accordingly, in the second embodiment, in the insulation inspection for the wires 2, a voltage can be applied to any area of the wire 2. Thus, in the second embodiment, in a case where, in the insulation inspection for the wires 2, a flaw is detected in the film of any of the wires 2, then whether the position of the flaw is between the intermediate jig 31 and the installation base 4 or between the intermediate jig 31 and the upper jig 32 can be easily identified.

Additionally, the installation base 4 of the insulation inspection device 1 according to the second embodiment includes a plurality of divisional installation bases 41. The plurality of divisional installation bases 41 are respectively disposed corresponding to the individual wires 2. In the second embodiment, the end 23 of one wire 2 is in contact with one divisional installation base 41. The plurality of divisional installation bases 41 are electrically separated from one another.

Furthermore, in the second embodiment, a plurality of installation base switches 93 are provided halfway through the wires connecting the plurality of divisional installation bases 41 and the discharge detection unit 6. The plurality of installation base switches 93 are respectively provided corresponding to the individual divisional installation bases 41. In the second embodiment, one installation base switch 93 is provided for one divisional installation base 41. Accordingly, the plurality of installation base switches 93 can each switch the electric connection between a corresponding one of the individual divisional installation bases 41 and the second terminal 52.

In a case where the wires 2 are inspected for insulation, with a predetermined installation base switch 93 of the plurality of installation base switches 93 turned on and the other installation base switches 93 turned off, a voltage is applied from the support member 3 to a predetermined wire 2. Then, the discharge state of the predetermined wire 2 can be detected. Accordingly, in the second embodiment, in the insulation inspection for the wires 2, the voltage can be applied exclusively to the predetermined wire 2 of the plurality of wires 2. Thus, in the second embodiment, in a case where, in the insulation inspection for the wires 2, a flaw is detected in the film of any of the wires 2, the wire 2 with the flaw can be easily detected in the plurality of wires 2.

Third Embodiment

A third embodiment will be described. The third embodiment is the same as the second embodiment except for a partial change in configuration of the insulation inspection device 1, and the remaining part of the configuration is the same for the second embodiment and the third embodiment. Thus, only the part different from the corresponding part of the second embodiment will be described.

Figure 9:
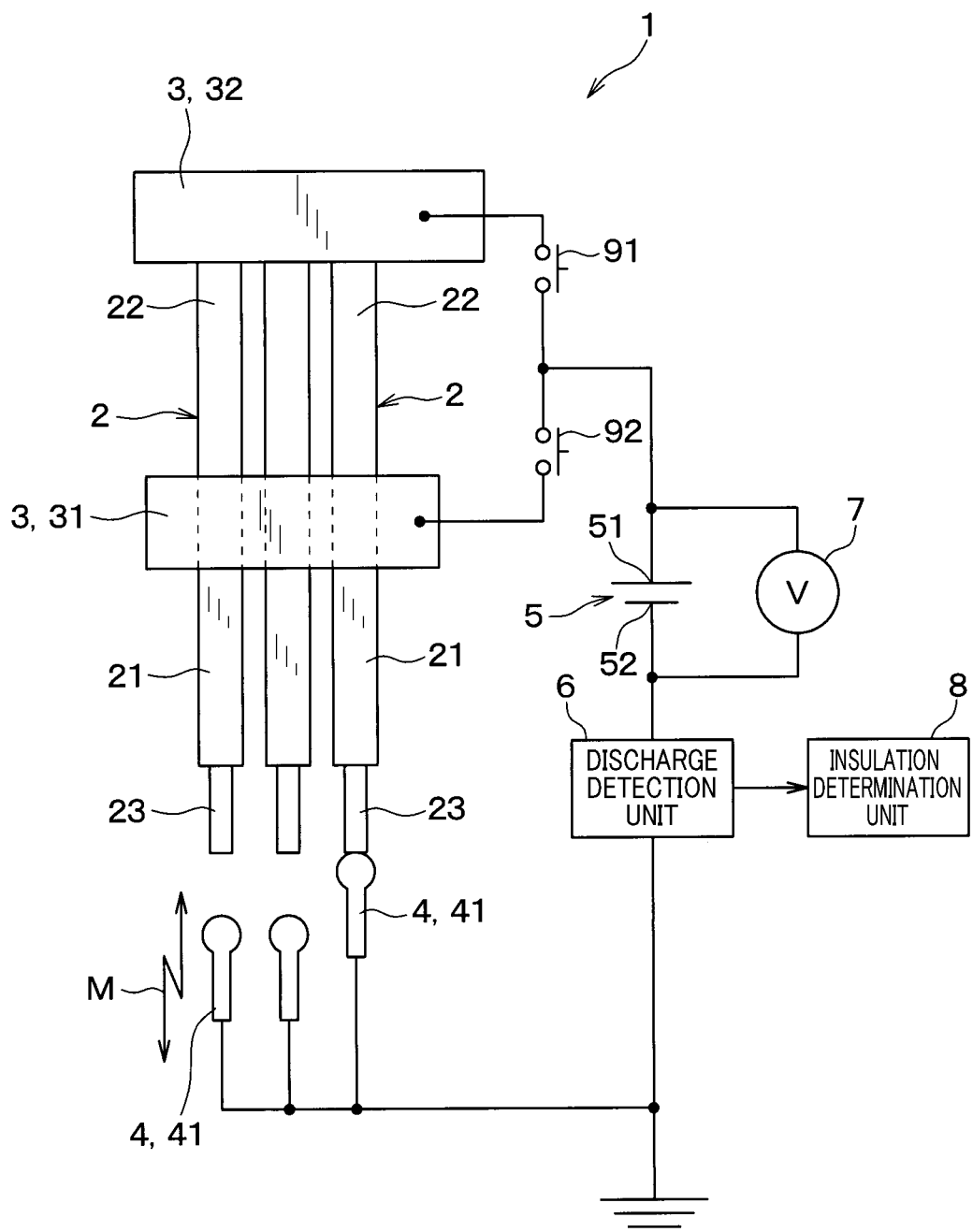
FIG. 9 is a schematic diagram illustrating a circuit configuration of an insulation inspection device according to a third embodiment.

As illustrated in FIG. 9, the installation base 4 included in the insulation inspection device 1 according to the third embodiment also includes a plurality of the divisional installation bases 41. As indicated by arrow M in FIG. 9, each of the plurality of divisional installation bases 41 is configured to be movable to a state in which the divisional installation base 41 is in contact with the end 23 of the corresponding wire 2 and to a state in which the divisional installation base 41 is away from the end 23 of the corresponding wire 2.

In a case where the wire is inspected for insulation, a predetermined divisional installation base 41 of the plurality of divisional installation bases 41 is in contact with the ends 23 of a predetermined wire 2, whereas the other divisional installation bases 41 are away from the ends 23 of the other wires 2. In this state, by applying a voltage to the predetermined wire 2 through the support member 3, the discharge state of the predetermined wire 2 of the plurality of wires 2 can be detected. Accordingly, as is the case with the second embodiment, in a case where a flaw is detected in the film of any of the wires 2 in the insulation inspection for the wires 2, the insulation inspection device 1 according to the third embodiment can easily identify the wire 2 with the flaw from among the plurality of wires 2.

Fourth Embodiment

A fourth embodiment will be described. The fourth embodiment is the same as the first embodiment except for a partial change in configuration of the insulation inspection device 1, and the remaining part of the configuration is the same for the first embodiment and the fourth embodiment. Thus, only the part different from the corresponding part of the first embodiment will be described.

Figure 10:
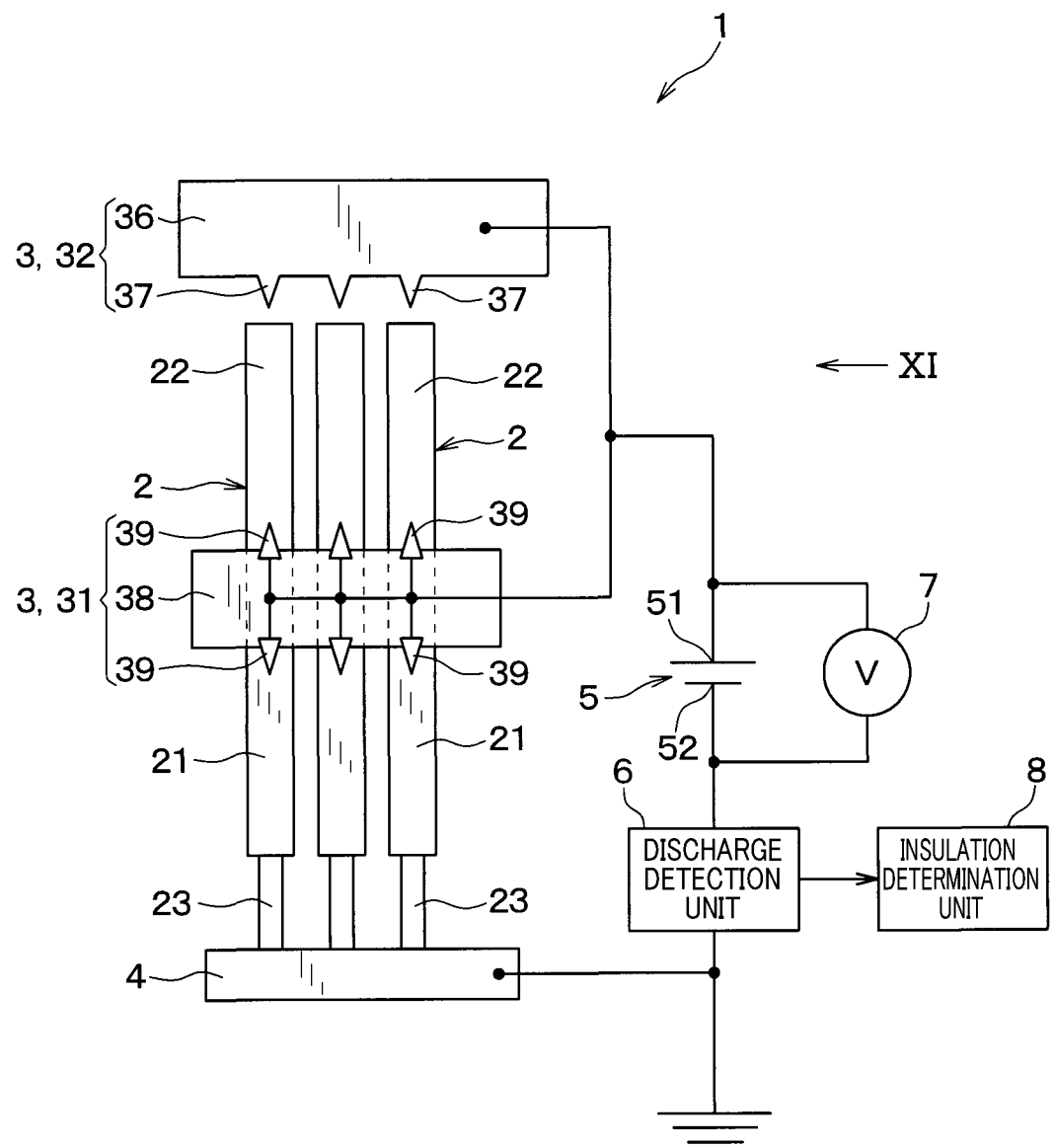
FIG. 10 is a schematic diagram illustrating a circuit configuration of an insulation inspection device according to a fourth embodiment.
Figure 11:
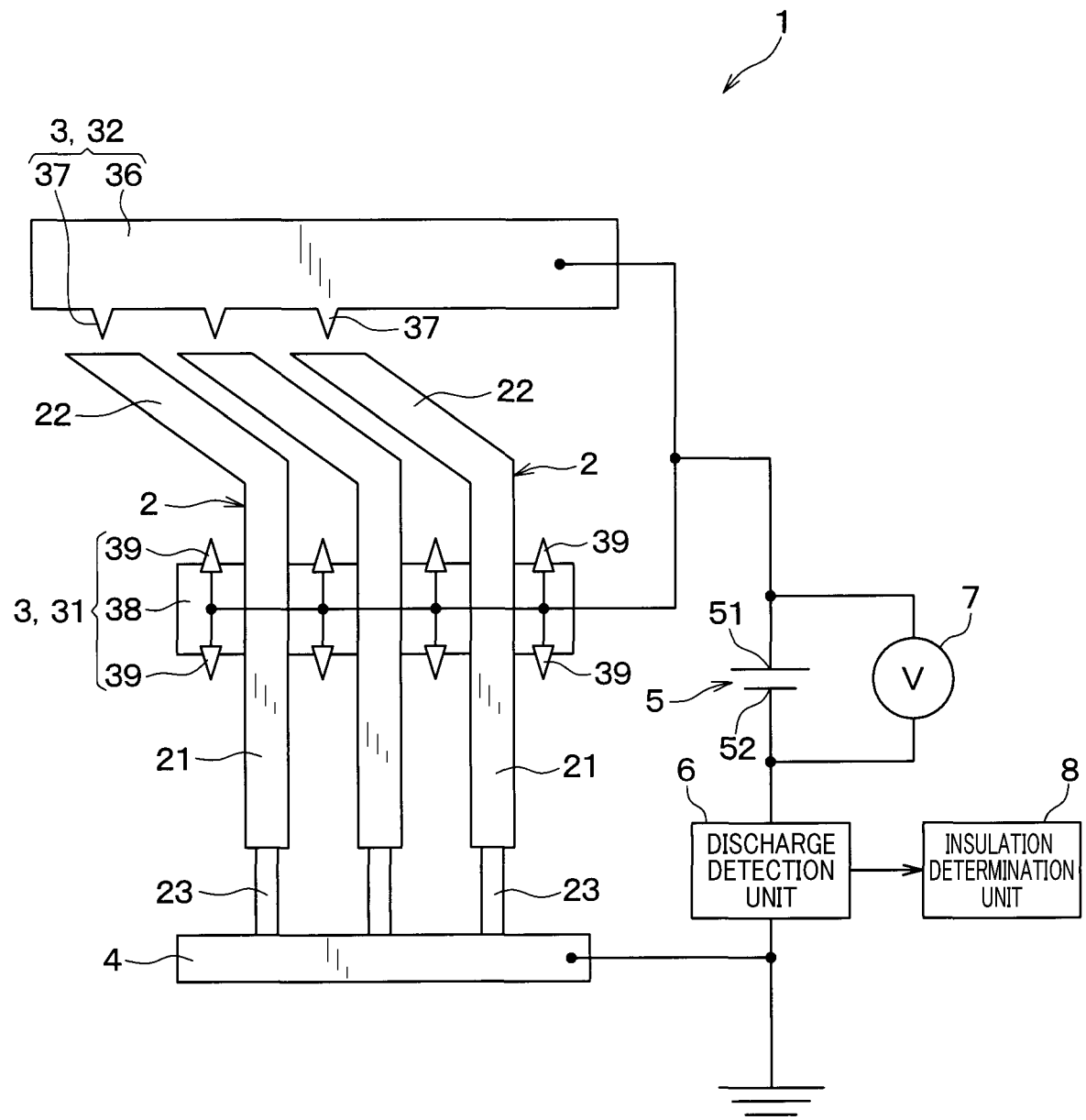
FIG. 11 is a schematic diagram illustrating the circuit configuration of the insulation inspection device as viewed in the direction of arrow XI in FIG. 10.

As illustrated in FIG. 10 and FIG. 11, the upper jig 32 included in the insulation inspection device 1 according to the fourth embodiment includes an upper jig main body 36 and a plurality of upper electrode portions 37 protruding from the upper jig main body 36 toward the wires 2. The plurality of upper electrode portions 37 are formed like needles. Additionally, the plurality of upper electrode portions 37 are disposed away from the plurality of wires 2. Note that the plurality of upper electrode portions 37 are electrically connected to the first terminal 51 of the power supply unit 5.

Additionally, the intermediate jig 31 included in the insulation inspection device 1 according to the fourth embodiment includes a plurality of resin members 38 and a plurality of inner electrode portions 39. The resin members 38 are disposed between and in contact with the straight portions 21 of the plurality of wires 2. The resin members 38 support the plurality of wires 2.

The plurality of inner electrode portions 39 are fixed to the resin members 38 and disposed away from the plurality of wires 2. Note that the plurality of inner electrode portions 39 are each formed in a needle shape. Additionally, the plurality of inner electrode portions 39 are electrically connected to the first terminal 51 of the power supply unit 5.

In the fourth embodiment described above, the upper electrode portions 37 of the upper jig 32 are disposed away from the wires 2, allowing the films of the wires 2 from being flawed. Additionally, the area of the intermediate jig 31 that is in contact with the wires 2 includes the resin members 38, allowing the films of the wires 2 from being flawed.

Furthermore, in the fourth embodiment, the plurality of inner electrode portions 39 of the intermediate jig 31 are each formed in a needle shape, facilitating concentration of electric fields. This allows limitation of the inspection range to facilitate targeting of the inspection range. Additionally, the plurality of upper electrode portions 37 of the upper jig 32 are each formed in a needle shape, facilitating concentration of electric fields. This allows limitation of the inspection range to facilitate targeting of the inspection range.

Other Embodiments

The present disclosure is not limited to the above-described embodiments, which can be appropriately changed within the scope recited in claims. The above-described embodiments are not irrelevant to one another and can be appropriately combined together except in a case where the combination is obviously impossible. In the above-described embodiments, the elements forming the embodiments are of course not necessarily be essential, for example, unless the elements are specified to be essential and unless the elements are in principle considered to be essential. In the above-described embodiments, in a case where the number, numerical value, amount, range, or the like is referred to for any the components of the embodiments, no limitation to the particular number is intended, for example, unless the number is specified to be essential and unless the component is in principle obviously limited to the particular number. In the above-described embodiments, in a case where the shape, position relationship, or the like is referred to for any the components or the like, no limitation to the shape, position relationship, or the like is intended, for example, unless the particular shape, position relationship, or the like is specified and unless the component is in principle limited to the particular shape, position relationship, or the like.

(1) In the above-described embodiments, the insulation inspection device 1 is described as inspecting, for the insulation state, the films of the wires 2 assembled into the stator core included in the rotating electric machine and used as an armature. However, no such limitation is intended. The insulation inspection device 1 may be configured to inspect, for the insulation state, the films of the wires 2 assembled into a rotor core included in the rotating electric machine and used as an armature.

(2) In the above-described embodiments, the wires 2 to be inspected by the insulation inspection device 1 are described as being generally U-shaped. However, no such limitation is intended. The shape of the wires 2 to be inspected by the insulation inspection device 1 can be optionally varied.

(3) In the above-described embodiments, the support member 3 included in the insulation inspection device 1 includes the intermediate jig 31 and the upper jig 32. However, no such limitation is intended. The upper jig 32 may be omitted from the support member 3, which may thus exclusively include the intermediate jig 31. Alternatively, the intermediate jig 31 may be omitted from the support member 3, which may thus exclusively include the upper jig 32.

(4) In the above-described embodiments, the power supply unit 5 included in the insulation inspection device 1 includes the first terminal 51 as a positive electrode and the second terminal 52 as a negative electrode. However, no such limitation is intended. The power supply unit 5 may include the first terminal 51 as a negative electrode and the second terminal 52 as a positive electrode.

(5) In the above-described embodiments, the power supply unit 5 included in the insulation inspection device 1 is an AC power supply. However, no such limitation is intended. The power supply unit 5 included in the insulation inspection device 1 may be an AC power supply.

(6) In the above-described second and third embodiments, the end 23 of one wire 2 is in contact with one divisional installation base 41. However, no such limitation is intended. The ends 23 of a plurality of the wires 2 may be in contact with one divisional installation base 41.

What is claimed is:

1. An insulation inspection device inspecting, for an insulation state, films of wires included in a rotating electric machine, the insulation inspection device comprising:
a power supply unit including a first terminal and a second terminal;

a support member supporting a plurality of the wires covered with the films before a plurality of the wires are assembled into a core of an armature in a rotating electric machine, the support member electrically connected to the first terminal;

an installation base on which areas of ends of a plurality of the wires from which areas the films are peeled off are installed, the installation base being electrically connected to the second terminal; and a discharge detection unit detecting discharge occurring between the support member and each of the wires when the power supply unit applies a voltage to the first terminal or the second terminal.

2. The insulation inspection device according to claim 1, further comprising:

a voltage detection unit detecting a potential difference between the first terminal and the second terminal; and an insulation determination unit determining whether the insulation state of each of the wires is acceptable based on a detection value from the discharge detection unit and a detection value from the voltage detection unit.

3. The insulation inspection device according to claim 1, wherein the support member is enabled to support a plurality of the wires temporarily assembled in a ring shape before a plurality of the wires are assembled into the core of the armature in the rotating electric machine.

4. The insulation inspection device according to claim 1, wherein the support member includes:

an intermediate jig disposed between a plurality of the wires to support a plurality of the wires temporarily assembled before a plurality of the wires are assembled into the armature in the rotating electric machine, the intermediate jig being enabled to apply a voltage to a plurality of the wires; and an upper jig disposed at a side of a plurality of the wires opposite to the installation base and enabled to apply a voltage to a plurality of the wires.

5. The insulation inspection device according to claim 4, wherein the intermediate jig includes:

a resin member disposed in contact with a plurality of the wires; and a plurality of inner electrode portions fixed to the resin member and disposed away from a plurality of the wires.

6. The insulation inspection device according to claim 4, wherein the upper jig includes a plurality of upper electrode portions disposed away from a plurality of the wires.

7. The insulation inspection device according to claim 4, further comprising:

an upper jig switch enabled to electrically connect or disconnect the first terminal to or from the upper jig; and an intermediate jig switch enabled to electrically connect or disconnect the first terminal to or from the intermediate jig.

8. The insulation inspection device according to claim 1, wherein the installation base includes a plurality of divisional installation bases electrically separated from one another, wherein the insulation inspection device further comprises a plurality of installation base switches each switching electric connection between a corresponding one of a plurality of the divisional installation bases and the second terminal.

9. The insulation inspection device according to claim 1, wherein the installation base includes a plurality of divisional installation bases electrically separated from one another, and each of a plurality of the divisional installation bases is enabled to move to a state where the divisional installation base is in contact with the end of a corresponding one of the wires and to a state where the divisional installation base is away from the end of the wire.

10. An insulation inspection method for inspecting, for an insulation state, films of wires included in a rotating electric machine, the insulation inspection method comprising:

before assembling, into a core of an armature in the rotating electric machine, a plurality of the wires covered with the films, supporting the plurality of wires using a support member and installing, on an installation base, areas of ends of a plurality of the wires from which areas the films are peeled off;

applying a voltage from a power supply unit to a plurality of the wires via the support member or the installation base and detecting discharge occurring between the support member and each of the wires; and determining whether the film of the wire is acceptable based on a discharge rate of the wire.

* * * * *